United States Patent
Kim et al.

(10) Patent No.: US 7,038,523 B2
(45) Date of Patent: May 2, 2006

(54) VOLTAGE TRIMMING CIRCUIT

(75) Inventors: Jung Pill Kim, Cary, NC (US);
Jungwon Suh, Apex, NC (US)

(73) Assignee: Infineon Technologies AG, Munich (DE)

( * ) Notice: Subject to any disclaimer, the term of this patent is extended or adjusted under 35 U.S.C. 154(b) by 25 days.

(21) Appl. No.: 10/681,647

(22) Filed: Oct. 8, 2003

(65) Prior Publication Data

US 2005/0077923 A1 Apr. 14, 2005

(51) Int. Cl.
*H03K 17/76* (2006.01)
(52) U.S. Cl. .................. 327/407; 327/408; 327/530
(58) Field of Classification Search ............... 327/540, 327/541, 538, 539, 542, 543
See application file for complete search history.

(56) References Cited

U.S. PATENT DOCUMENTS

| | | | | |
|---|---|---|---|---|
| 4,384,277 | A | * | 5/1983 | Allgood et al. ............. 341/150 |
| 5,517,444 | A | * | 5/1996 | Ishimura et al. ............. 365/63 |
| 5,546,042 | A | * | 8/1996 | Tedrow et al. ............... 327/538 |
| 5,838,076 | A | | 11/1998 | Zarrabian et al. ........... 307/115 |
| 5,970,009 | A | * | 10/1999 | Hoenigschmid et al. .... 365/226 |
| 6,255,895 | B1 | | 7/2001 | Kim et al. ................... 327/530 |
| 6,316,991 | B1 | * | 11/2001 | Muyshondt et al. ........ 327/543 |
| 6,455,952 | B1 | | 9/2002 | Wang .......................... 307/115 |
| 6,489,759 | B1 | * | 12/2002 | Acharya et al. ............. 323/297 |
| 6,496,027 | B1 | | 12/2002 | Sher et al. ................... 324/763 |
| 6,835,884 | B1 | * | 12/2004 | Iwamoto et al. ............... 84/609 |
| 2001/0013769 | A1 | | 8/2001 | Saito ........................... 323/282 |
| 2001/0017567 | A1 | | 8/2001 | Kawakubo ................... 327/540 |
| 2001/0054760 | A1 | | 12/2001 | Ito et al. ....................... 257/691 |

FOREIGN PATENT DOCUMENTS

| | | |
|---|---|---|
| EP | 0 701 259 A | 3/1996 |
| JP | 3062734 | 3/1991 |
| JP | 2002 083928 A | 3/2002 |

OTHER PUBLICATIONS

PCT International Search Report dated Jan. 4, 2005.
PCT Written Opinion dated Jan. 4, 2005.
R. Torres-Torres, R.S. Murphy-Arteaga and S. Decoutere, *MOSFET Gate Resistance Determination*, Electronic Letters, 23$^{rd}$ Jan. 2003, vol. 39, No. 2, pp. 248-250, IEE Stevenage, GB.
A. Ortiz-Conde et al., Series Resistance and Effective Channel Length Extraction of n-channel MOSFET at 77 K, Electronic Letters, 14$^{th}$ Apr. 1994, vol. 30, No. 8, pp. 670-672, IEE Stevenange, GB.

* cited by examiner

*Primary Examiner*—Tuan T. Lam
*Assistant Examiner*—Hiep Nguyen
(74) *Attorney, Agent, or Firm*—Patterson & Sheridan, L.L.P.

(57) ABSTRACT

Methods and circuits for minimizing or eliminating the effect of trimming circuits in a voltage generating circuit are provided. In general, the effects of channel resistance of switches of the trimming circuit are reduced by utilizing switches in series with the output, rather than in parallel with resistors, as in conventional trimming circuits. Because the switches are not in parallel with the resistors, when the switches are turned on, no channel resistance is added to the effective resistance controlled by the trimming circuit.

16 Claims, 4 Drawing Sheets

VOLTAGE TRIMMING CIRCUIT

BACKGROUND OF THE INVENTION

1. Field of the Invention

The present invention generally relates to integrated circuit (IC) devices and, more particularly, to trimming circuits used to adjust the levels of voltages generated internally to such devices.

2. Description of the Related Art

Integrated circuit (IC) devices often operate using various internally generated voltages in an effort to reduce sensitivity to fluctuating external voltage supplies. Internal voltage generating circuits used in such devices often include trimming circuits to adjust the generated voltages, for example, to compensate for variations introduced by the manufacturing process. Trimming circuits are adjusted to bring internally generated voltages as close as possible to a target voltage during a testing procedure. Typically, the trimming circuits are adjusted, via a set of one or more switches that may be open or closed to increase or decrease the level of the generated voltage.

For example, FIG. 1 illustrates a simplified example of a conventional trimming circuit 150 including a set of transfer switches $152_0$ and $152_1$ used to adjust (i.e., trim) the output voltage $V_{OUT}$ of a voltage generator circuit 144. As illustrated, $V_{OUT}$ may be generated as a function of a reference voltage $V_{REF}$ (supplied by a reference voltage generator 142) and a voltage divider circuit (made up of resistors R0, R1, RA and RB). As $V_{OUT}$ may be supplied to a large number of components distributed throughout a chip (e.g., via a power bus), $V_{REF}$ may be supplied, via a comparator 145 to a p-mos driver 147 that typically has a larger driving capability than the reference voltage generator 142.

As illustrated, the set of transfer switches $152_0$ and $152_1$ may be used to vary $V_{OUT}$ by varying the effective resistance between nodes $N_B$ and $N_0$ (hereinafter referred to as $R_{TRIM}$) by selectively shunting across resistors $R_A$ and $R_B$. $V_{OUT}$ may be expressed as a function of $V_{REF}$ and $R_{TRIM}$ according to the following formula:

$$V_{OUT} = \left(1 + \frac{R_1 + R_{TRIM}}{R_0}\right) \cdot V_{REF}$$

Assuming (for the moment) the transfer switches have no associated channel resistance, $R_{TRIM}$ may be varied from zero to $R_A + R_B$. The transfer switches $152_0$ and $152_1$ are typically controlled by a set of control signals C[0] and C[1] derived from a set of fuses 160 or bits in a register, either of which are typically set during a calibration or test procedure in which $V_{OUT}$ is compared to an externally supplied target voltage. For example, one or more of the fuses 160 may be cut (or blown) to increase or decrease the value of $V_{OUT}$, in an effort to match the target voltage as closely as possible.

As illustrated, in a base setting, with both fuses intact (e.g., not blown or cut), C[0]=0 and C[1]=0, the transfer switch $152_1$ may be closed, while the transfer switch $152_0$ may be open, effectively removing $R_B$ from $R_{TRIM}$ (the path of the flow of current $I_{BASE}$ for the base setting is shown as a dotted line). Thus, the base setting for $V_{OUT}$ may be expressed, by modifying the equation above, as:

$$V_{OUT} = \left(1 + \frac{R_1 + R_A}{R_0}\right) \cdot V_{REF}$$

In order to decrease $V_{OUT}$, the first fuse can be cut, as shown in the table 110 of FIG. 1, effectively removing $R_A$ from $R_{TRIM}$, as well, making the numerator smaller. Thus, a decreased setting for $V_{OUT}$ may be expressed as:

$$V_{OUT} = \left(1 + \frac{R_1}{R_0}\right) \cdot V_{REF}.$$

Alternatively, the second fuse could be cut (C[1]=1), leaving the first fuse intact (C[0]=0), effectively adding $R_B$ to $R_{TRIM}$. Thus, an increased setting for $V_{OUT}$ may be expressed as:

$$V_{OUT} = \left(1 + \frac{R_1 + R_A + R_B}{R_0}\right) \cdot V_{REF}$$

Cutting both fuses may increase or decrease $V_{OUT}$, depending on the values of $R_A$ and $R_B$. In other words, if $R_A > R_B$, cutting both fuses will decrease $V_{OUT}$, if $R_A < R_B$, cutting both fuses will increase $V_{OUT}$, relative to the base setting.

As previously stated, the equations listed above assume zero channel resistance of the transfer switches. However, this is not a valid assumption, as there is some finite channel resistance associated with each transfer switch ($R_{XFER}$). Thus, to include the effect of series channel resistance of the transfer switch $152_1$, the equation for the base setting of $V_{OUT}$ should be modified as follows:

$$V_{OUT} = \left(1 + \frac{R_1 + R_A + R_{XFER}}{R_0}\right) \cdot V_{REF}$$

Unfortunately, the value of channel resistance is subject to process variations and has been observed to generally increase with temperature and vary with changing operating voltages. Moreover, in most voltage generators, a number of fuses and switches are utilized to achieve the desired resolution of adjustment, which will increase the effect of channel resistance. As an example, if a trim circuit has N transfer switches in series at any given time, the channel resistance will increase by a factor of N, such that:

$$V_{OUT} = \left(1 + \frac{R_1 + R_A + R_{XFER} \cdot N}{R_0}\right) \cdot V_{REF}$$

Thus, the level of $V_{OUT}$ may vary substantially with changing temperatures and operating voltages, particularly if the trimming circuit has a relatively large number of switches.

Accordingly, there is a need for an improved trimming circuit for use with a voltage generator, preferably with reduced sensitivity to transfer switch channel resistance.

SUMMARY OF THE INVENTION

The present invention generally provides methods, circuits, and devices to reduce the sensitivity of a voltage, generated internally to a device, to channel resistance of switches used to adjust the level of the voltage.

One embodiment provides a method for reducing the sensitivity of a voltage generated internally to a circuit device to channel resistance of switches utilized to adjust a level of the voltage. The method generally includes providing a voltage dividing circuit with a plurality of serially connected resistors, supplying the voltage dividing circuit with a reference voltage, resulting in a different voltage level at nodes of the voltage dividing circuit formed between the serially connected resistors, and providing a plurality of switches, to selectively couple an output node, on which the voltage is supplied, to a single node of the voltage dividing circuit.

Another embodiment provides a trimming circuit for use in adjusting a voltage generated internally to an integrated circuit device. The trimming circuit generally includes a plurality of switches to selectively couple an output node on which the voltage is supplied to a single one of a plurality of nodes of a voltage dividing circuit, wherein each node is at a different voltage level.

Another embodiment provides a memory device generally including peripheral circuitry, a plurality of memory cells, a voltage generating circuit comprising a voltage divider circuit with a plurality of nodes, each at different voltage levels dependent on a reference voltage, and a plurality of switches. The plurality of switches are generally arranged to selectively couple an output node of the voltage generating circuit with a single one of the voltage divider circuit nodes.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention generally provides an improved trimming circuit that minimizes or eliminates the effect of the trimming circuit in a voltage generating circuit. In general, the effects of channel resistance of switches are reduced by utilizing switches in series with the output, rather than in parallel with resistors, as in conventional trimming circuits. Because the switches are not in parallel with the resistors, when the switches are turned on, no channel resistance is added to the effective resistance controlled by the trimming circuit.

The trimming circuits described herein may be used to advantage in any number of devices that utilize internally generated voltages. However, to facilitate understanding, the following description will refer to memory devices, such as dynamic random access memory (DRAM) devices, as specific, but not limiting examples of devices in which the trimming circuits may be utilized. Further, while the following description may refer to fuses cut (or left intact) to indicate the setting of a trimming circuit, those skilled in the art will recognize that such settings may also be stored in any other type of suitable non-volatile storage elements, such as bits of non-volatile memory registers.

An Exemplary Memory Device

Figure 2:
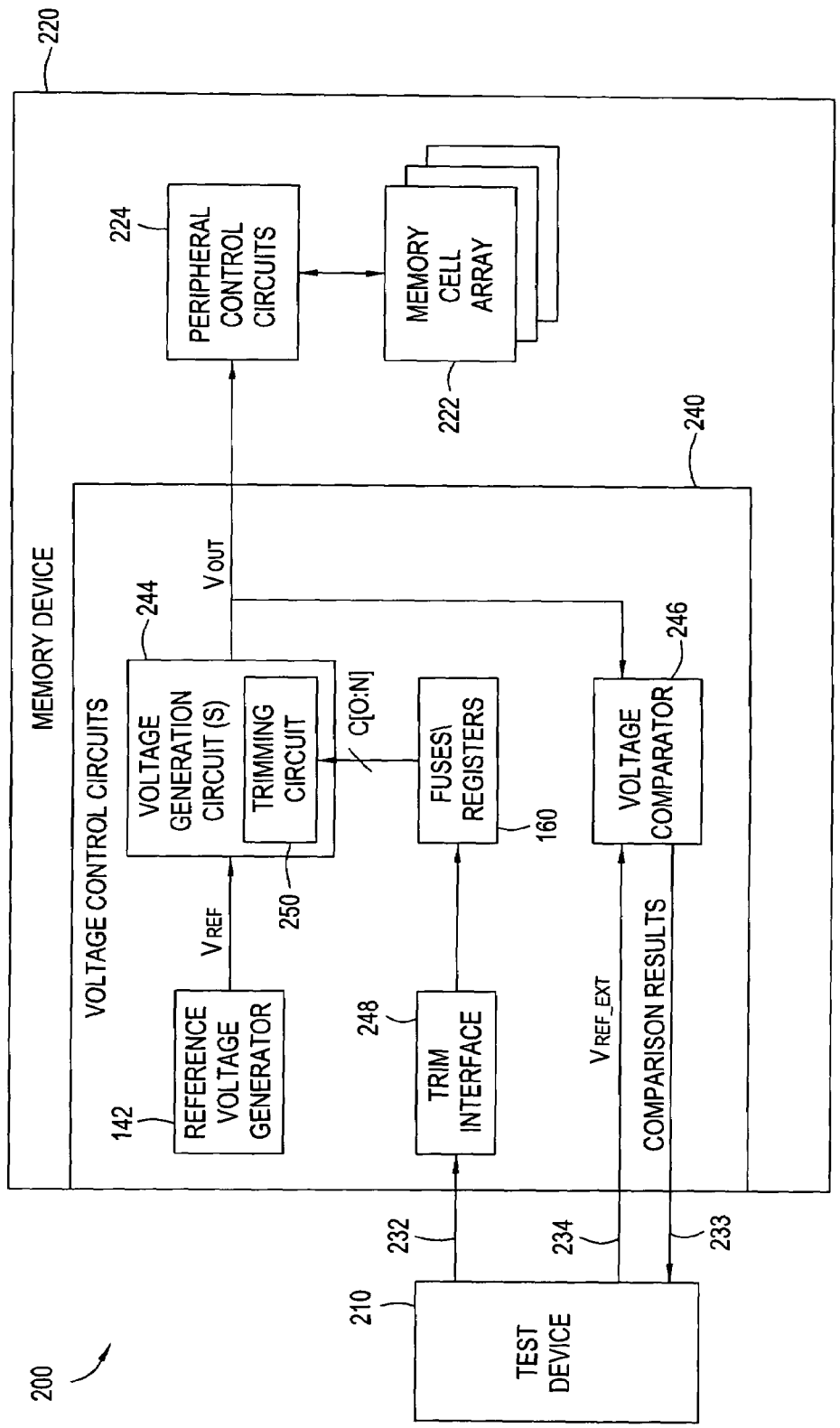
FIG. 2 illustrates an exemplary memory device with a trimming circuit according to embodiments of the present invention.

FIG. 2 illustrates a system 200, in which a trimming circuit 250 in accordance with embodiments of the present invention may be utilized to adjust the output voltage $V_{OUT}$ of a voltage generation circuit 244 of an exemplary memory device 220. As illustrated, $V_{OUT}$ may be generated as a function of a reference voltage $V_{REF}$ generated by a reference voltage generator 142 and may be supplied to one or more peripheral circuits 224 used to access (e.g., read, write or refresh) memory cell arrays 222. A typical memory device 220, such as a dynamic random access memory (DRAM) device may include many such voltage generation circuits 244, configured to generate a wide range of voltages, which may include voltages that are positive with respect to a ground reference (e.g., a boosted wordline voltage or $V_{PP}$) and voltages that are negative with respect to a ground reference (e.g., a back-bias voltage, $V_{BB}$, or negative wordline voltage, $V_{NWL}$), any of which may be adjusted by a separate trimming circuit 250. Alternatively, a single reference voltage used to generate a number of different voltages may be adjusted as described herein.

In either case, the generated voltage $V_{OUT}$ is typically compared to an external reference voltage $V_{REF\_EXT}$ provided on an input (e.g., a pad) 234 of the memory device 220, by a test device 210. As illustrated, $V_{OUT}$ and $V_{REF\_EXT}$ may be input into a voltage comparator 246 that provides feedback to the test device 210 (via one or more outputs 233) indicating the results of the comparison. The feedback may comprise any suitable type of indication of whether $V_{OUT}$ should be increased ($V_{OUT} < V_{REF\_EXT}$), decreased ($V_{OUT} > V_{REF\_EXT}$), or is within an acceptable tolerance of $V_{REF\_EXT}$ ($V_{OUT} \approx V_{REF\_EXT}$). In response to this feedback, the test device 210 may adjust the trimming circuit via a trim interface 248, for example, controlled by one or more address or control lines 232. This process may be repeated until $V_{OUT}$ matches $V_{REF\_EXT}$ within a specified tolerance, as indicated by the feedback lines 233. The current setting of the trimming circuit 250 may then be stored by cutting/burning appropriate fuses 160, or storing the setting in a non-volatile memory register, either of which may be read during a power up sequence to adjust $V_{OUT}$.

Exemplary Trimming Circuits

Figure 3:
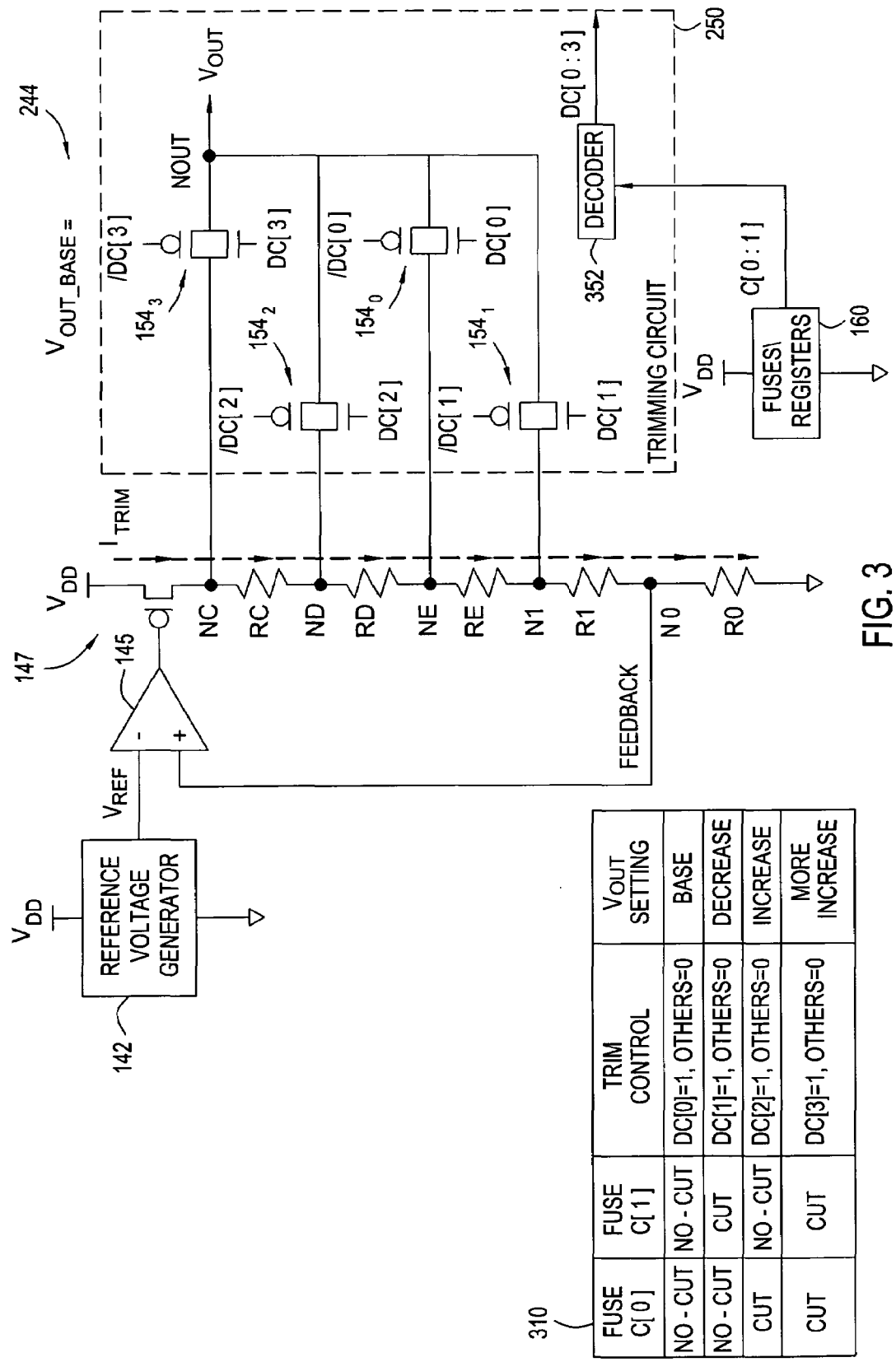
FIG. 3 illustrates an exemplary voltage generation circuit utilizing a trimming circuit in accordance with one embodiment of the present invention.

FIG. 3 illustrates one exemplary circuit configuration of the trimming circuit 250. As illustrated, the trimming circuit 250 may include a set of switches 154 (as shown, $154_0$–$154_3$) that may be used to adjust $V_{OUT}$ by selectively coupling a single node of a voltage divider circuit (formed by resistors $R_0$–$R_1$ and $R_C$–$R_E$) to an output node $N_{OUT}$. In other words, each switch 154 is placed in series with a node of the voltage divider circuit and the output node $N_{OUT}$. In the illustrated arrangement, the path of current $I_{TRIM}$ through the p-mos driver 147 flows through all of the resistors, regardless of the state of the switches 154. Accordingly, in contrast to the prior art, channel resistance of the switches 154 will have little or no impact on $V_{OUT}$, as the current $I_{TRIM}$ does not flow through any of the switches 154. While a resistive voltage divider circuit is shown, any other type of voltage dividing circuit may also be utilized in accordance with present invention.

Operation of the trimming circuit 250 may best be described with reference to table 310 which illustrates the state of the fuses 160 corresponding to various settings of $V_{OUT}$. While the use of only two fuses is illustrated, allowing for four different settings for $V_{OUT}$, the actual number of fuses and settings for $V_{OUT}$ will vary with different devices, for example, depending on how accurately $V_{OUT}$ should match $V_{REF\_EXT}$. Further, in the illustrated configuration, only one of the switches 154 is closed at any given time, in order to couple the output node $N_{OUT}$.

Figure 1:
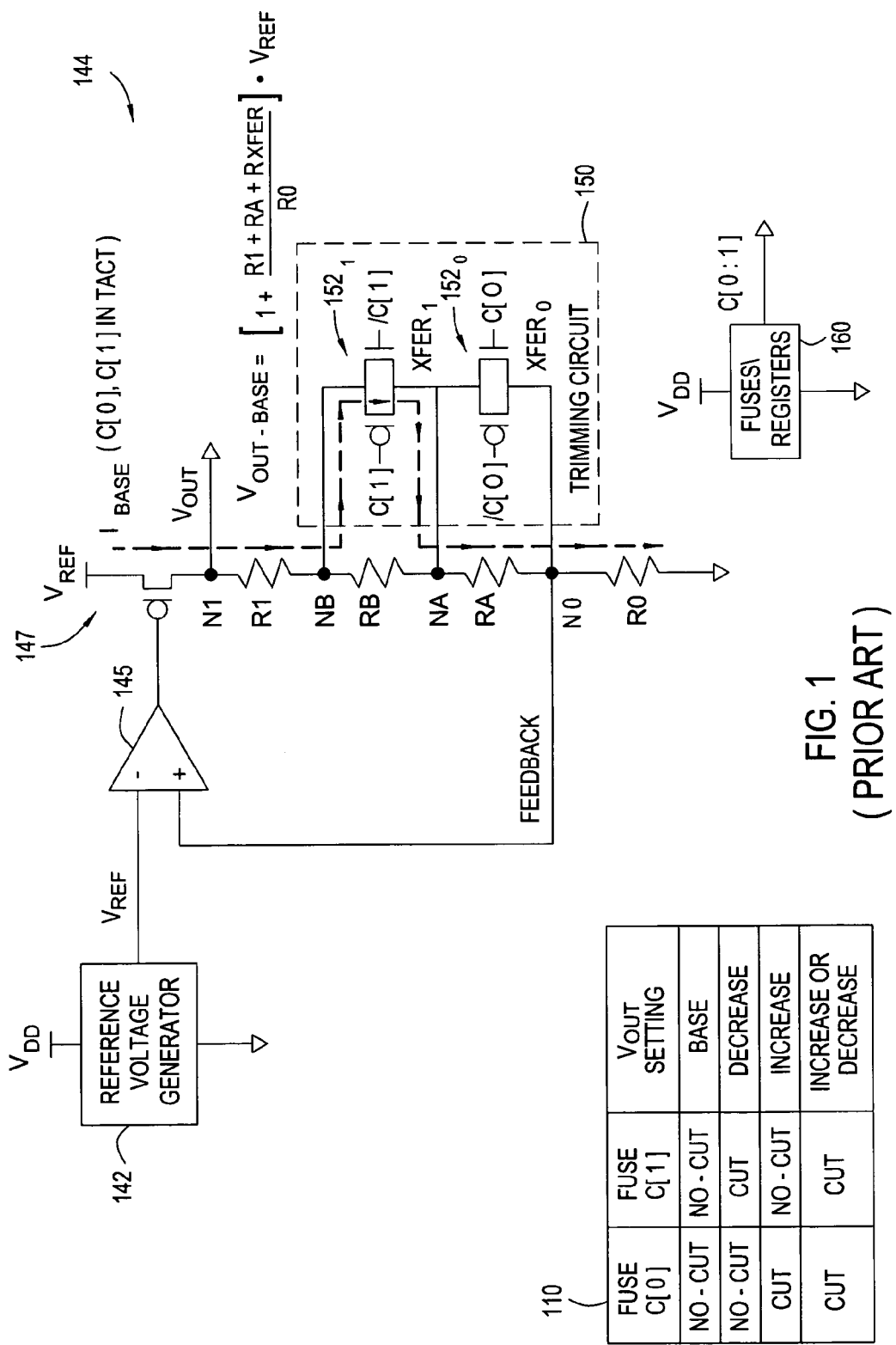
FIG. 1 illustrates an exemplary voltage generation circuit utilizing a trimming circuit in accordance with the prior art.

In order to generate a separate control signal for each switch 154, the fuse signals C[0:1] are input to a decoder 352 that asserts a single one of a set of decoded control signals DC[0:3] to close a corresponding switch 154. Of course, for other embodiments, a separate fuse may be provided for each switch. An advantage with the illustrated embodiment, however, is that existing test devices 110 configured to operate with a given number of fuses may be used with the trimming circuit described herein, possibly extending the life of expensive test equipment. This is illustrated by a comparison of table 110 of FIG. 1 with table 310 of FIG. 3, which reveals logically similar fuse settings for correspond settings of $V_{OUT}$.

For example, in a base setting, with no fuses cut (C[0]=C[1]=0), control signal DC[0] will be asserted, closing switch $154_0$ and coupling the output node $N_{OUT}$ to node $N_E$. Thus, the base setting of $V_{OUT}$ may be expressed as:

$$V_{OUT\_BASE} = \left(1 + \frac{R_1 + R_E}{R_0}\right) \cdot V_{REF}$$

Because the current $I_{TRIM}$ does not flow through the switches, the voltage level of $V_{OUT}$ is not dependent on channel resistance of the switches.

To decrease the level of $V_{OUT}$ from the base level, the first fuse may be left intact and the second fuse cut (C[0]=0, C[1]=1), asserting control signal DC[1], closing switch $154_1$ and coupling the output node $N_{OUT}$ to node $N_1$. Thus, the base setting of $V_{OUT}$ may be expressed as:

$$V_{OUT\_DECREASE} = \left(1 + \frac{R_1}{R_0}\right) \cdot V_{REF}$$

In a similar manner, VOUT may be increased by cutting the first fuse (C[0]=1), coupling the output node $N_{OUT}$ to node $N_D$ if the second fuse is left intact (C[1]=0, asserting DC[2]), or further increased by cutting the first and second fuses ((C[0]=C[1]=1, asserting DC[3]). Regardless of the setting, the voltage level of VOUT is insensitive to channel resistance of the switches.

Figure 4:
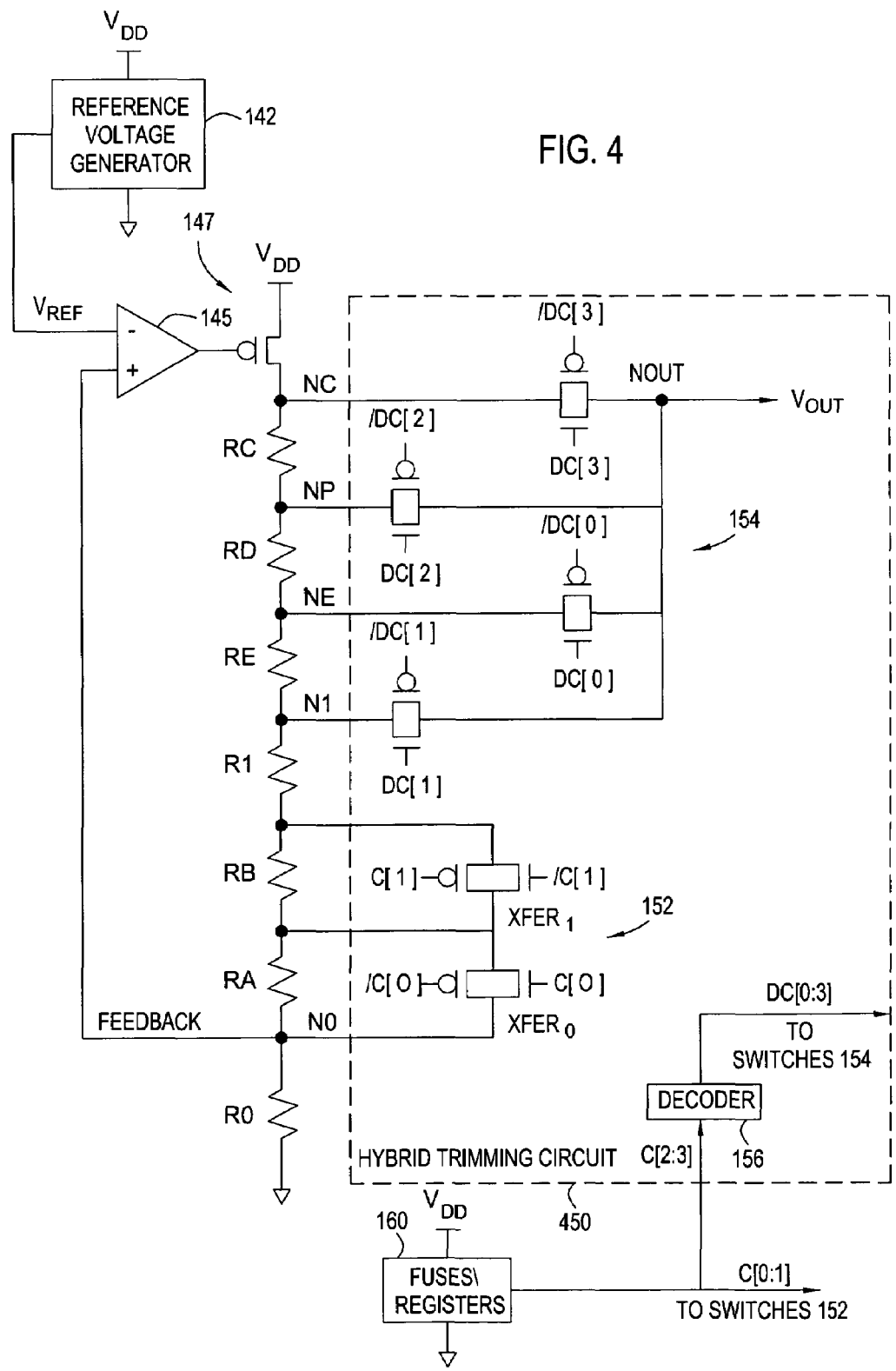
FIG. 4 illustrates an exemplary voltage generation circuit utilizing a trimming circuit in accordance with another embodiment of the present invention.

As illustrated in FIG. 4, for some embodiments, a trimming circuit 450 may include a conventional arrangement of switches 152 in parallel with resistors $R_A$–$R_B$ of a voltage divider circuit in combination with an arrangement of switches 154 in series with nodes of the voltage divider. As illustrated, signals C[0:1] corresponding to two fuses 160 may control the switches 152, while signals C[2:3] corresponding to two other fuses may be used to generate four signals DC[0:3] that control the switches 154.

While the switches 152 and 154 may be of the same type, as described above, due to the different arrangements, the level of $V_{OUT}$ will be insensitive to channel resistance of the switches 154, but sensitive to channel resistance of the switches 152 will. However, the two different arrangements may be effectively combined to reduce the effect of channel resistance in case that there are many trimming steps, while limiting the number of switches required (i.e., saving device real estate). For example, as previously described, each of the arrangements is capable of producing four different levels of $V_{OUT}$. In other words, for any given setting of the switches 154, the switches 152 may be varied to produce four different levels of $V_{OUT}$. Thus, a total of sixteen different levels of $V_{OUT}$ may be produced with a total of six switches, with the channel resistance of only two of the switches in series at any given time.

By contrast, to achieve sixteen different levels of $V_{OUT}$ with only the arrangement of switches 154 (with no effective channel resistance) would require sixteen switches. While sixteen different levels of $V_{OUT}$ may be achieved with an arrangement of four switches 152, the channel resistance of up to four switches may be in series (i.e., at a minimum voltage setting with all switches closed), which may result in unacceptable variations in $V_{OUT}$ over a specified range of operating temperatures and voltages. Thus, a combination of arrangements, as shown in FIG. 4, may provide an attractive compromise between reduced sensitivity to channel resistance and conservation of real estate.

Conclusion

The present invention provides trimming circuits that reduce the effect of switch channel resistance on a voltage level adjusted thereby. The effect of channel resistance may be reduced by placing the switches in series with nodes of a voltage divider circuit, rather than in parallel with resistors. By reducing the effect of channel resistance, as described herein, a device may be capable of producing reference voltages internally that match a targeted level within a given tolerance over a wider range of operating temperatures and voltages.

While the foregoing is directed to embodiments of the present invention, other and further embodiments of the invention may be devised without departing from the basic scope thereof, and the scope thereof is determined by the claims that follow.

What is claimed is:

1. A method for adjusting a level of a voltage at an output node, the voltage being generated internally to an integrated circuit device, the method comprising:
   providing a voltage dividing circuit with a plurality of serially connected resistors;
   supplying the voltage dividing circuit with a reference voltage, resulting in a different voltage level at nodes of the voltage dividing circuit formed between the serially connected resistors;
   providing a plurality of switches, each switch configured to selectively couple the output node to a single node of the voltage dividing circuit;
   providing control signals to close a single one of the switches at any given time, wherein each of the control signals corresponds to a different one of the switches and only one of the control signals is asserted at any time to close a single switch; and
   generating the control signals as a function of states of one or more non-volatile storage elements, wherein the states are determined based on an output of a voltage comparator comparing the voltage at the output node to an external reference voltage.

2. The method of claim 1, wherein the non-volatile storage elements are fewer in number than the control signals.

3. The method of claim 1, further comprising providing one or more switches in parallel with one or more of the resistors of the voltage dividing circuit, each to selectively bypass the one or more resistors.

4. A trimming circuit for use in adjusting a voltage at an output node, the voltage being generated internally to an integrated circuit device, comprising:
   a plurality of switches, each switch configured to selectively couple the output node to a single one of a plurality of nodes of a voltage dividing circuit, wherein each node is at a different voltage level;
   wherein a single switch is coupled between the output node and each node of the voltage dividing circuit; and
   wherein the plurality of switches open and close in response to control signals generated as a function of states of one or more non-volatile storage elements, wherein the states are determined based on an output of a voltage comparator comparing the voltage at the output node to an external reference voltage.

5. The trimming circuit of claim 4, further comprising a decoder configured to assert a single one of the control signals as a function of the states of the one or more non-volatile storage elements.

6. The trimming circuit of claim 4, wherein the number of switches is greater than the number of non-volatile storage elements.

7. The trimming circuit of claim 4, wherein:
   the voltage divider circuit comprises a number of serially connected resistors; and
   the trimming circuit further comprises at least one additional switch connected in parallel to, and to selectively bypass, one of the serially connected resistors.

8. A memory device comprising:
   peripheral circuitry;
   a plurality of memory cells;
   a voltage generating circuit comprising a voltage divider circuit with a plurality of nodes, each at different voltage levels dependent on a reference voltage;
   a plurality of switches, each switch configured to selectively couple an output node of the voltage generating circuit with a single one of the voltage divider circuit nodes; and
   a plurality of non-volatile memory elements, wherein the switches are controlled by control signals generated as a function of states of the non-volatile storage elements, wherein the states are determined based on an output of a voltage comparator comparing the voltage at the output node to an external reference voltage.

9. The memory device of claim 8, further comprising a decoder to generate the control signals, wherein the number of control signals is greater than the number of non-volatile storage elements.

10. The memory device of claim 8, wherein the voltage generating circuit is configured to generate a negative voltage, with respect to a ground reference.

11. The memory device of claim 10, wherein the memory device is a dynamic random access memory device and the negative voltage is to be supplied to substrates of transistors of the memory cells.

12. The memory device of claim 8, wherein the memory device is a dynamic random access memory device and the voltage generating circuit is configured to generate a voltage to be supplied to wordlines of the memory cells via the peripheral circuitry.

13. The memory device of claim 8, wherein:
   the voltage dividing circuit comprises serially connected resistive elements; and
   the memory device further comprises at least one additional switch to selectively bypass one or more of the serially connected resistive elements.

14. The memory device of claim 13, further comprising a plurality of fuses, wherein:
   a first one or more signals generated based on a first one or more of the fuses control the plurality of switches; and
   a second one or more signals generated based on a second one or more of the fuses control the at least one additional switch.

15. A memory device comprising:
   peripheral circuitry;
   a plurality of memory cells;
   a voltage generating circuit comprising a voltage divider circuit with a plurality of nodes, each at different voltage levels dependent on a reference voltage; and
   a plurality of switches, each switch configured to selectively couple an output node of the voltage generating circuit with a single one of the voltage divider circuit nodes.
   wherein the voltage dividing circuit comprises serially connected resistive elements;
   wherein the memory device further comprises at least one additional switch to selectively bypass one or more of the serially connected resistive elements;

wherein a first one or more signals generated based on a first one or more of the fuses control the plurality of switches; and wherein a second one or more signals generated based on a second one or more of the fuses control the at least one additional switch.

16. A memory device comprising:

peripheral circuitry;

a plurality of memory cells;

a voltage generating circuit comprising a voltage divider circuit with a plurality of nodes, each at different voltage levels dependent on a reference voltage, wherein the voltage dividing circuit comprises serially connected resistive elements;

a plurality of switches to selectively couple an output node of the voltage generating circuit with a single one of the voltage divider circuit nodes;

at least one additional switch to selectively bypass one or more of the serially connected resistive elements;

a plurality of non-volatile memory elements, wherein the switches are controlled by control signals generated based on states of the non-volatile storage elements; and a plurality of fuses, wherein:

a first one or more signals generated based on a first one or more of the fuses control the plurality of switches; and a second one or more signals generated based on a second one or more of the fuses control the at least one additional switch.

* * * * *

UNITED STATES PATENT AND TRADEMARK OFFICE
CERTIFICATE OF CORRECTION

| | | |
|---|---|---|
| PATENT NO. | : 7,038,523 B2 | Page 1 of 1 |
| APPLICATION NO. | : 10/681647 | |
| DATED | : May 2, 2006 | |
| INVENTOR(S) | : Jung Pill Kim et al. | |

It is certified that error appears in the above-identified patent and that said Letters Patent is hereby corrected as shown below:

In Claim 15 at Column 8, Line 62, replace "nodes." with --nodes,--.

Signed and Sealed this

Fifth Day of December, 2006

JON W. DUDAS
*Director of the United States Patent and Trademark Office*